US011463057B2

(12) United States Patent
Kemper

(10) Patent No.: US 11,463,057 B2
(45) Date of Patent: Oct. 4, 2022

(54) METHOD FOR ADAPTING A SOUND CONVERTER TO A REFERENCE SOUND CONVERTER

(71) Applicant: Christoph Kemper, Recklinghausen (DE)

(72) Inventor: Christoph Kemper, Recklinghausen (DE)

(*) Notice: Subject to any disclaimer, the term of this patent is extended or adjusted under 35 U.S.C. 154(b) by 20 days.

(21) Appl. No.: 16/997,612

(22) Filed: Aug. 19, 2020

(65) Prior Publication Data

US 2021/0058049 A1 Feb. 25, 2021

(30) Foreign Application Priority Data

Aug. 20, 2019 (DE) ...................... 10 2019 005 855.0

(51) Int. Cl.
*H03G 3/30* (2006.01)
*H04R 29/00* (2006.01)
(Continued)

(52) U.S. Cl.
CPC ........... *H03G 3/3005* (2013.01); *G06F 17/12* (2013.01); *G10L 25/18* (2013.01); *H04R 3/00* (2013.01); *H04R 29/00* (2013.01)

(58) Field of Classification Search
CPC ...... H03G 3/3005; H03G 5/165; G06F 17/12; G10L 25/18; G10L 21/00; H04R 3/00;
(Continued)

(56) References Cited

U.S. PATENT DOCUMENTS 7,664,274 B1 * 2/2010 Graumann ............. H04H 20/31
381/2
9,099,069 B2 * 8/2015 Shinoda ................ G10H 1/125
(Continued)

FOREIGN PATENT DOCUMENTS

DE    10 2015 110 938 A1   7/2015
EP        1 883 064 B1      7/2007
WO   WO-2008067454 A2 *   6/2008 ............. G06F 16/60

OTHER PUBLICATIONS

F. Eichas et al., "Gray-Box Modeling of Tuitar Amplifiers", J. Audio Eng. Soc., vol. 66, No. 12, pp. 1006-1015 /Dec. 2018).
(Continued)

*Primary Examiner* — Akelaw Teshale
(74) *Attorney, Agent, or Firm* — Craft Chu PLLC; Andrew W. Chu

(57) ABSTRACT

The method for adapting a sound converter to a reference sound converter includes the sound converter having a first linear transfer function with a first frequency response, a second linear transfer function with a second frequency response, and a trivial nonlinearity. The sound converter has a non-linear transfer function corresponding to the frequency response from combination of the first linear transfer function, the trivial nonlinearity, and the second linear transfer function. A first frequency spectrum of the reference sound converter is determined at a low input level. A second frequency spectrum of the reference sound converter is determined at a high input level. The second determined frequency spectrum is used as the second frequency response in the second linear transfer function, and the division of the first frequency spectrum by the second frequency spectrum is used as the first frequency response in the first linear transfer function.

9 Claims, 4 Drawing Sheets

(51) Int. Cl.
*G06F 17/12* (2006.01)
*H04R 3/00* (2006.01)
*G10L 25/18* (2013.01)

(58) Field of Classification Search
CPC .......... H04R 29/00; H04R 3/04; H04R 3/007; H04R 1/1008; H04R 3/005; H04R 5/04; H04R 11/02; H04R 1/005; H04R 1/1016; H04R 1/1058; H04R 1/22; H04R 1/32; H04R 1/323; H04R 1/406; H04R 2201/029; H04R 2225/77; H04R 3/12; H04R 5/033; H04R 2499/13; H04R 29/001; H04R 3/02; H04R 2410/05; H04R 2499/11; H04R 1/1091; H04R 2201/401; H04R 2201/403; H04R 2201/405; H04R 2430/03; H04R 25/505; H04R 25/70; H04R 29/003; H04R 17/00; H04R 1/083; H04R 2201/023; H04R 2400/03; H04R 2420/07; H04R 2430/23; H04R 2460/03; H04R 5/02; H04R 19/00; H04R 19/005; H04R 1/2826; H04R 1/2834; H04R 1/288; H04R 1/403; H04R 2205/041; H04R 2209/022; H04R 2209/041; H04R 2225/025; H04R 2225/67; H04R 2307/207; H04R 2410/01; H04R 2420/01; H04R 2430/01; H04R 2460/05; H04R 2460/09; H04R 25/00; H04R 25/353; H04R 25/356; H04R 25/50; H04R 25/502; H04R 29/004; H04R 29/005; H04R 3/002; H04R 3/06; H04R 5/027; H04R 7/18; H04R 7/20; H04R 9/06; G10H 2250/111; G10H 3/187; G10H 2210/311; G10H 1/00; G10H 1/02; H04S 2400/15
See application file for complete search history.

(56) References Cited

U.S. PATENT DOCUMENTS

| | | | | |
|---|---|---|---|---|
| 9,626,949 | B2* | 4/2017 | Wang | G10H 7/002 |
| 9,980,075 | B1* | 5/2018 | Benattar | H04S 7/303 |
| 2007/0140058 | A1* | 6/2007 | McIntosh | H04R 3/04 |
| | | | | 367/140 |
| 2015/0086031 | A1* | 3/2015 | Goto | G10K 11/17817 |
| | | | | 381/71.8 |
| 2019/0355380 | A1* | 11/2019 | Hatfield | H03G 3/3005 |

OTHER PUBLICATIONS

A. Farina "Simultaneous Measurement of Impulse Response and Distortion With a Swept-Sine Technique" Presented at the 108th Audio Engineering Society Convention, Feb. 2000.

* cited by examiner

METHOD FOR ADAPTING A SOUND CONVERTER TO A REFERENCE SOUND CONVERTER

CROSS-REFERENCE TO RELATED APPLICATIONS

See Application Data Sheet.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

1. Field of the Invention

The present invention relates to a sound converter and a method for adapting a sound converter to a reference sound converter.

2. Description of Related Art Including Information Disclosed Under 37 CFR 1.97 and 37 CFR 1.98

The sound generation of a musical instrument is usually carried out in three steps. First, the musical instrument is excited, for example, by stroking a bow over the string of a violin, striking a hammer on a string of a piano, or blowing against a reed of a saxophone. In a second step, parts of the excited frequency spectrum are deliberately amplified or attenuated in one or more resonators. The resonator or resonators typically determine the basic frequency of the individual tones. The resonators can have constant or variable properties. Examples of resonators of the above-mentioned musical instruments are the strings of the violin, the effective length of which can be continuously varied by the violin player in terms of a resonator having variable properties, the strings of the piano, the length of which is typically invariable, so that they can be referred to as a resonator having constant properties, and the air column of the saxophone, the length of which can be changed by closing/opening valves of the saxophone arranged at predetermined intervals, so that a resonator having variable properties is also provided. In a third step, the vibration energy introduced into the instrument by means of the excitation, the frequency components of which have been deliberately amplified/attenuated in the resonator, are emitted to the surrounding air using a sound transducer. The sound box of the violin, the sound board of the piano, or the funnel of the saxophone acts as a transducer.

The above-described examples of sound transducers regularly ensure not only a transmission of the vibrations to the surrounding air, but rather also significantly influence the individual sound character of an instrument. Even untrained people can typically distinguish the sound of a violin from the sound of a viola, although the instruments differ essentially only in the size of the sound box. It can therefore also be referred to as a sound converter.

In the case of an electrical musical instrument, for example an electric violin or an electric guitar, the chain of pickups, amplifiers, and loudspeakers can be regarded as a sound converter.

In the case of electric musical instruments in particular, a sound converter is regularly to be adapted to a reference sound converter. For this purpose, a method for adapting a sound converter to a reference sound converter is known from EP 1 883 064 B1, wherein the sound converter has a first vibration profile having a first frequency response, a second vibration profile having a second frequency response, and a trivial nonlinearity connected between the first and the second vibration profiles, and the sound converter has its own intrinsic profile, which corresponds to the frequency response which results from the combination of the first vibration profile, the trivial nonlinearity, and the second vibration profile. In the known method, a first reference profile of the reference sound converter is determined at low input level and a second reference profile of the reference sound converter is determined at high input level. The first and second frequency response of the sound converter are controlled such that at low input level, at which the intrinsic profile of the sound converter is not influenced by the nonlinearity, it corresponds to the product of the first and second frequency response. Furthermore, the first and second frequency response of the sound converter are controlled such that at high input level, at which the intrinsic profile of the sound converter is influenced by the nonlinearity, the difference between the intrinsic profile of the sound converter and the second reference profile is minimized and the product of the first and second frequency response still corresponds to the first reference profile.

It has been shown that to control the frequency responses depending on the reference sound converter, different numbers of loops have to be run through to minimize the difference. It is therefore regularly not foreseeable how much time is required for adapting the sound converter to the reference sound converter.

BRIEF SUMMARY OF THE INVENTION

Proceeding from the known prior art, the present invention is therefore based on the object of specifying a deterministic method for adapting a sound converter to a reference sound converter and a deterministic sound converter which can be adapted to a reference sound converter.

This object has been achieved according to the invention by the subject matter of the main and concurrent claims. Advantageous designs are specified in the dependent claims.

A method is proposed for adapting a sound converter to a reference sound converter, wherein the sound converter has a first linear transfer function having a first frequency response, a second linear transfer function having a second frequency response, and a trivial nonlinearity connected between the first and second transfer function, wherein the sound converter has a nonlinear transfer function that corresponds to the frequency response which results from the combination of the first linear transfer function, the trivial nonlinearity, and the second linear transfer function, wherein a first frequency spectrum of the reference sound converter is determined at low input level, wherein a second frequency spectrum of the reference sound converter is determined at high input level. The method is characterized in that the second frequency spectrum is determined by using a sweep having an exponential frequency curve as the input signal, measuring a corresponding output signal of the sound converter, deconvoluting the output signal using the input signal, in that the second determined frequency spectrum is used as the second frequency response in the second linear transfer function, in that the division of the first frequency spectrum by the second frequency spectrum is used as the first frequency response in the first linear transfer function.

A trivial nonlinearity is distinguished in that it has quasi-linear behavior at low amplitude. In addition, with a trivial nonlinearity, there can be an absolute upper and lower amplitude limitation. Furthermore, the characteristic curve of a trivial nonlinearity can be monotonous. The characteristic curve of the trivial nonlinearity can be free of hysteresis. Furthermore, the trivial nonlinearity can be distinguished in that it has no memory. This can be understood to mean that the trivial nonlinearity always delivers the same output variable for the same input variable, regardless of the previous signal curve. Two fundamental parameters of the trivial nonlinearity, the amplification in the quasilinear range and the level of the absolute amplitude limitation, can be selected freely in the proposed sound converter.

A sweep is understood to be a vibration having a constant amplitude, wherein the frequency of the vibration increases exponentially.

A measurement at a low input level can be understood in particular to mean a measurement in the linear range of the transfer function of the reference sound converter.

A measurement at a high input level can be understood in particular to mean a measurement in which the reference sound converter is operated in the maximum distorted range.

An example of the determination of a frequency spectrum using a sine sweep having an exponential frequency curve as the input signal, measuring a corresponding output signal, and deconvoluting the output signal with the input signal is described in the article Angelo Farina, "Simultaneous Measurement of Impulse Response and Distortion With a Swept-Sine Technique", Audio Engineering Society Convention 108, February 2000, http://www.aes.org/e-lib/browse.cfm?elib=10211.

The use of the above-described method for determining the second frequency spectrum can enable the effects of a nonlinearity of the reference sound converter to be eliminated from the frequency spectrum.

In a first design of the method, a sine sweep is used as a sweep having an exponential frequency profile. A sine sweep can be generated particularly easily using known signal generators.

The sweep used can in particular have an initial frequency of greater than 20 Hz and/or a cutoff frequency of less than 20 kHz.

In principle, the first frequency spectrum can also be determined by using a sweep having an exponential frequency curve as the input signal, measuring a corresponding output signal of the sound converter, and deconvoluting the output signal using the input signal. A test signal having the same frequency profile can thus be used for determining the first and second frequency spectrum, wherein the test signal only differs in the amplitude. This can further simplify the expenditure on equipment for adapting the sound converter.

In a further design, the second linear transfer function comprises a second phase response, wherein the second phase response is determined from the output signal deconvoluted using a high input level.

Furthermore, the first linear transfer function can comprise a first phase response, wherein the first phase response is determined from the output signal deconvoluted using low input level.

By determining the phase response, the sound converter can be adapted even better to the reference sound converter. For example, the reference sound converter can comprise a combination of a guitar amplifier, a loudspeaker, and a room in which the guitar amplifier is located. The transfer function of a reference sound converter, which contains a room reverb, is defined both by its frequency response and also by its phase response. The room reverb can also be adapted by adapting the sound converter to the frequency response and phase response of the reference sound converter.

In principle, however, detecting the phase response can also be dispensed with, whereby the computational effort can be reduced when adapting the sound converter. For example, in the case of minimal-phase reference sound converters, in which the phase response displays only a low frequency dependence, such a procedure can be useful.

Furthermore, a sound converter is proposed, wherein the sound converter has a first linear transfer function having a first frequency response, a second linear transfer function having a second frequency response, and a trivial nonlinearity connected between the first and second linear transfer function, and wherein the sound converter can be adapted to a reference sound converter according to one of the above-described methods.

The sound converter can be formed at least partially as a digital circuit. In particular, the sound converter can have a memory in order to store the determined frequency spectra and the associated input signals. The sound converter can also comprise a processor, which is configured to carry out the proposed calculations.

The sound converter can furthermore be part of a digital guitar amplifier.

In a further exemplary embodiment, the sound converter can comprise a signal generator for generating a sweep having an exponential signal curve. This can make the provision of a separate signal generator unnecessary, so that the outlay for equipment is further reduced for the user of an adaptable sound converter.

BRIEF DESCRIPTION OF THE SEVERAL VIEWS OF THE DRAWINGS

The invention will be explained in greater detail hereinafter on the basis of exemplary embodiments.

DETAILED DESCRIPTION OF THE INVENTION

Figure 1:
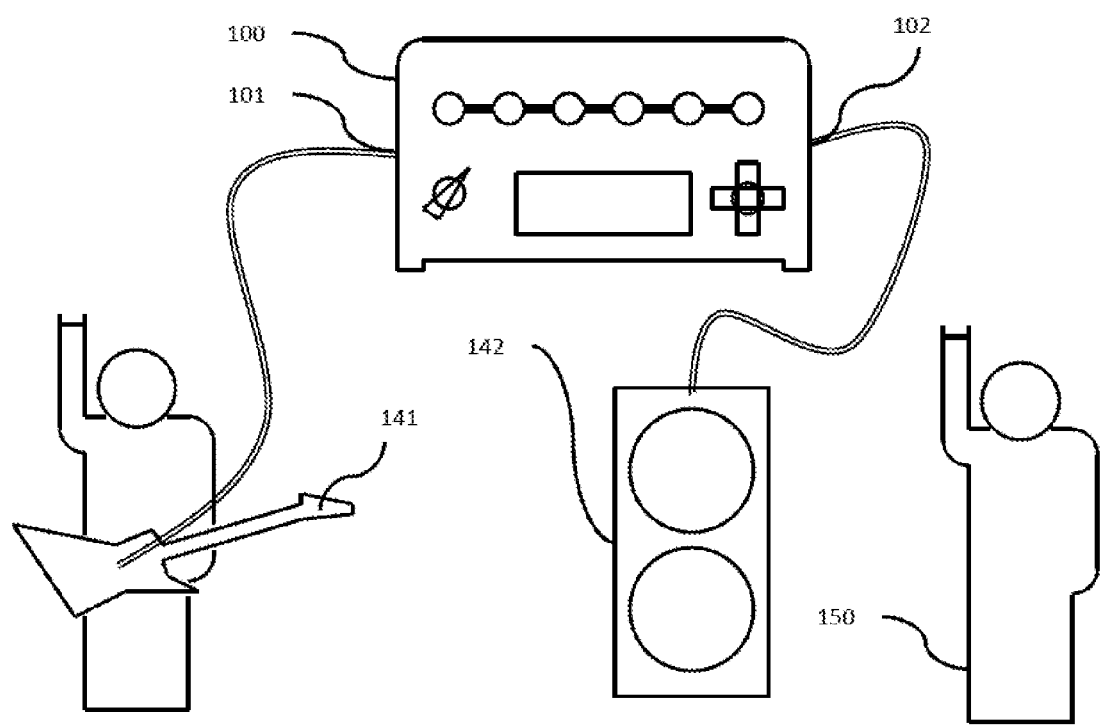
FIG. 1 shows a schematic view of an illustration of music playback using a sound converter.
Figure 2:
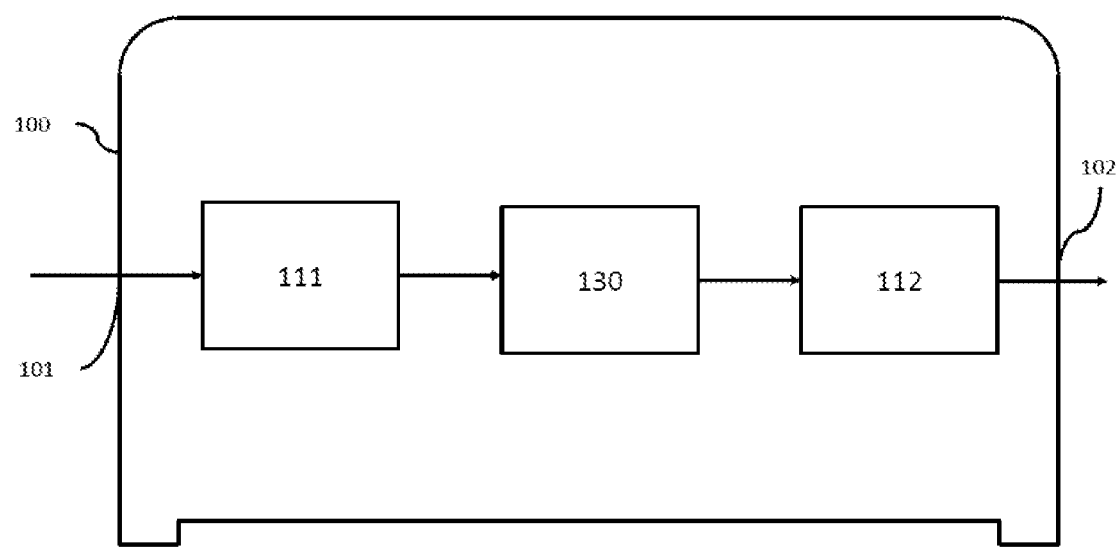
FIG. 2 shows a schematic view of an illustration of the sound converter.

The sound converter 100 shown in FIGS. 1 and 2 has an input 101 for an input signal and an output 102 for an output signal. Furthermore, the sound converter 100 has a first linear transfer function 111 having a first frequency response and a second linear transfer function 112 having a second frequency response. A trivial nonlinearity 130 is connected between the first linear transfer function 111 and the second linear transfer function 112. For example, the signal from a pickup of an electric guitar 141 can be used as the input signal of the sound converter 100. The output signal of the sound converter 100 can then, optionally after further amplification, be output as a sound signal via a loudspeaker 142, so that the listeners 150 can perceive the guitar music. The sound reproduced via the loudspeaker 142 can therefore be influenced by means of the sound converter 100.

Figure 3:
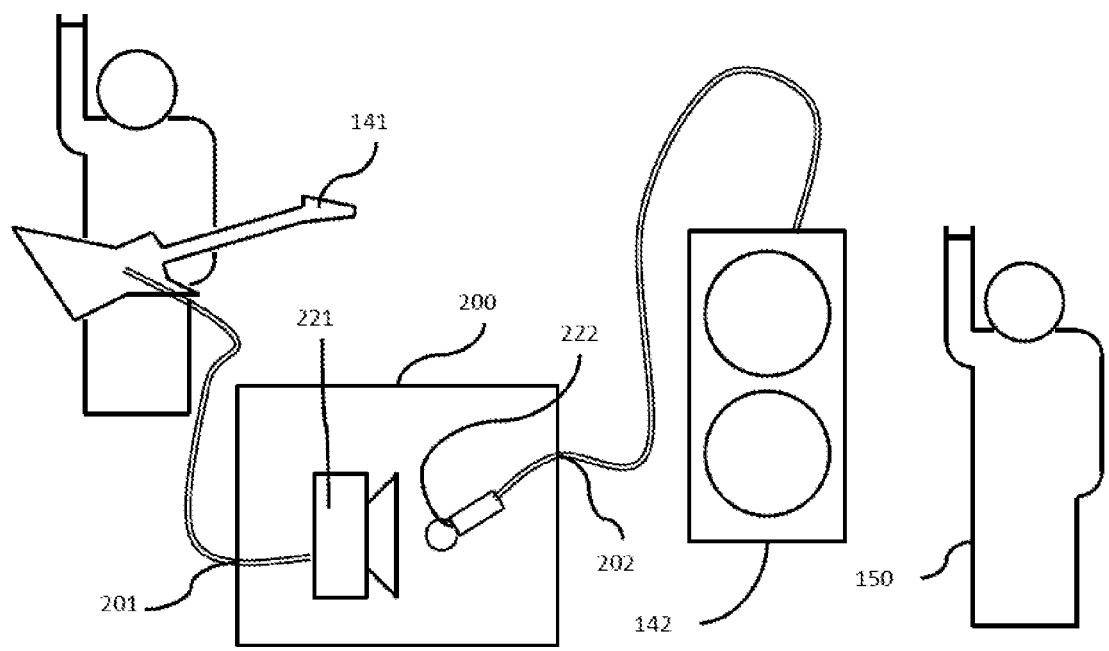
FIG. 3 shows a schematic view of an illustration of music playback using a reference sound converter.

An example of a reference sound converter 200 is illustrated in FIG. 3. In the exemplary embodiment shown, the signal from a pickup of the electric guitar 141 is amplified using a classic guitar amplifier 221 and output as sound via the monitor loudspeaker integrated into the guitar amplifier 221. The sound is then recorded by means of a microphone 222 and, if necessary after further amplification, output via the loudspeakers 142 so that the listeners 150 can hear the guitar music. The guitar amplifier 221 used, its monitor loudspeaker, and the microphone significantly influence the sound perceived by the listener 150.

In the present case, the sound converter 100 is to be adapted in terms of its sound to the sound of the given reference sound converter 200.

Figure 4:
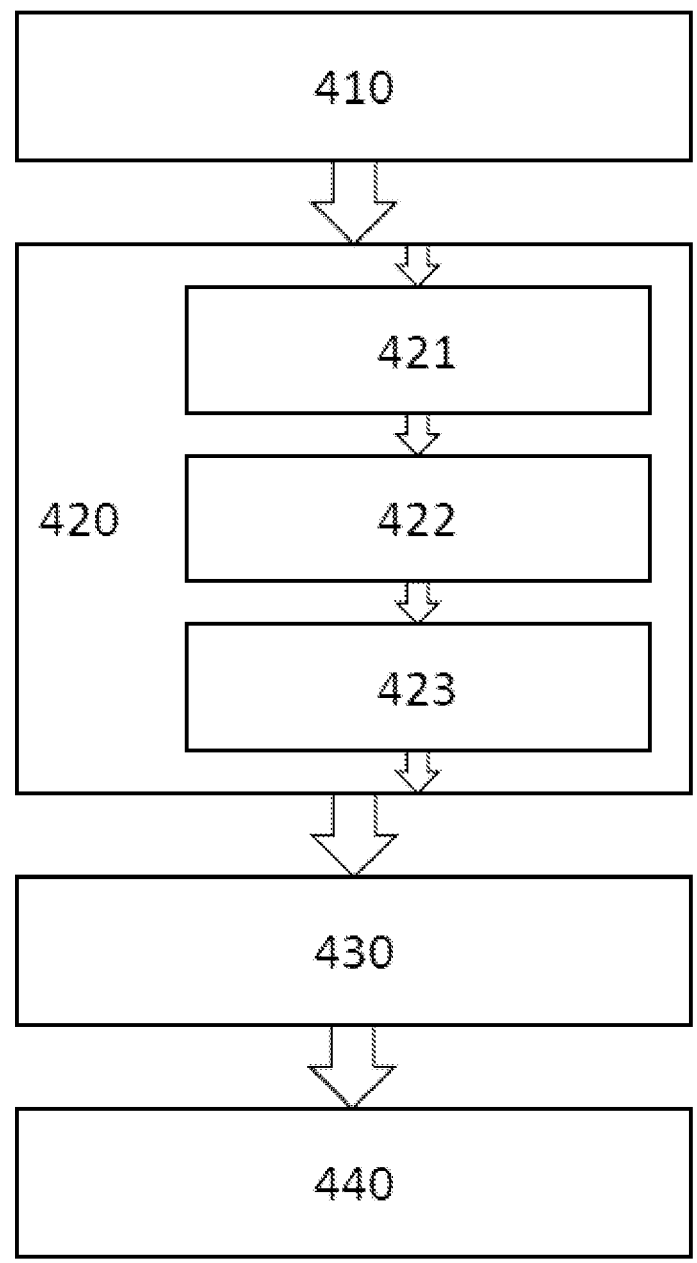
FIG. 4 shows a schematic view of a flow chart for adapting the sound converter to the reference sound converter.

For this purpose, as shown in FIG. 4, a first frequency spectrum of the reference sound converter is determined at a first input level or low input level, i.e., at a low amplitude of the input signal (step 410). A second frequency spectrum of the reference sound converter is then determined at a second or high input level (step 420). For this purpose, a sweep, in particular a sine sweep having an exponential frequency curve, is used as the input signal and the corresponding output signal is measured (step 421). By deconvoluting the output signal using the input signal (step 422), the second frequency spectrum of the reference sound converter is determined. This can be done by cutting out the linear pulse response from the time signal resulting from the deconvolution (step 423). The second determined frequency spectrum is then used as the second frequency response in the second linear transfer function (430). By dividing the first frequency spectrum by the second frequency spectrum, the first frequency response is then obtained (step 440), which is used in the first linear transfer function.

A particularly simple method is therefore proposed, using which a sound converter can be adapted to a reference sound converter.

LIST OF REFERENCE NUMBERS

100 sound converter
101 input of the sound converter
102 output of the sound converter
111 first linear transfer function
112 second linear transfer function
130 trivial nonlinearity
141 electric guitar
142 speakers
150 listeners
200 reference sound converter
201 input of the reference sound converter
202 output of the reference sound converter
221 guitar amplifier having integrated monitor speaker
222 microphone

I claim:

1. A method for preparing a sound converter to adapt a sound of the sound converter to a sound of a reference sound converter, the method comprising the steps of:
   determining a first frequency spectrum of the sound converter with an intrinsic profile,
   wherein the sound converter has a first linear transfer function having a first frequency response, a second linear transfer function having a second frequency response, and a trivial nonlinearity connected between said first linear transfer function and said second linear transfer function,
   wherein the sound converter has a non-linear transfer function corresponding to a frequency response resulting from a combination of said first linear transfer function, said trivial nonlinearity, and said second linear transfer function, and
   wherein said first frequency spectrum is determined at a first input level, corresponding to said intrinsic profile not being influenced by said trivial nonlinearity; and
   determining a second frequency spectrum at a second input level, corresponding to said intrinsic profile being influenced by said trivial nonlinearity,
   wherein the step of determining said second frequency spectrum is comprised of the steps of:
   using a sweep having exponential frequency curve as an input signal at said second input level,
   measuring a corresponding output signal of the sound converter, and
   deconvoluting said output signal using said input signal so as to generate a second determined frequency spectrum,
   wherein said second determined frequency spectrum is comprised of said second frequency response in said second linear transfer function,
   wherein a division of said first frequency spectrum by said second frequency spectrum is comprised of said first frequency response in said first linear transfer function, and
   wherein said second linear transfer function comprises a second phase response determined from the step of deconvoluting said output signal.

2. The method for preparing a sound converter to adapt a sound of the sound converter to a sound of a reference sound converter, as in claim 1,
   wherein said sweep is comprised of a sine sweep having an exponential frequency curve.

3. The method for preparing a sound converter to adapt a sound of the sound converter to a sound of a reference sound converter, as in claim 1,
   wherein said sweep has an initial frequency of greater than 20 Hz.

4. The method for preparing a sound converter to adapt a sound of the sound converter to a sound of a reference sound converter, as in claim 1,
   wherein said sweep has a cutoff frequency of less than 20 kHz.

5. The method for preparing a sound converter to adapt a sound of the sound converter to a sound of a reference sound converter, as in claim 1,
   wherein the step of determining said first frequency spectrum is comprised of the steps of:
   using another sweep having an exponential frequency curve as another input signal at said first input level,
   measuring another corresponding output signal of the sound converter, and
   deconvoluting said another output signal using said another input signal.

6. The method for preparing a sound converter to adapt a sound of the sound converter to a sound of a reference sound converter, as in claim 5,
  wherein said first linear transfer function comprises a first phase response determined from the step of deconvoluting said another output signal.

7. The method for preparing a sound converter to adapt a sound of the sound converter to a sound of a reference sound converter, as in claim 1,
  wherein the sound converter is comprised of a digital circuit.

8. The method for preparing a sound converter to adapt a sound of a sound converter to a sound of a reference sound converter, as in claim 1,
  wherein the sound converter is comprised of a digital guitar amplifier.

9. The method for preparing a sound converter to adapt a sound of a sound converter to a sound of a reference sound converter, as in claim 1,
  wherein the sound converter is comprised of a signal generator for sweeps having an exponential signal curve.

* * * * *